United States Patent
Ahn et al.

(10) Patent No.: US 11,017,525 B2
(45) Date of Patent: May 25, 2021

(54) SEMICONDUCTOR PATTERN DETECTING APPARATUS

(71) Applicant: Samsung Electronics Co., Ltd., Suwon-si (KR)

(72) Inventors: Jae Hyung Ahn, Seoul (KR); Souk Kim, Seoul (KR); Joon Seo Song, Seoul (KR); Young Hoon Sohn, Incheon (KR); Yu Sin Yang, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 102 days.

(21) Appl. No.: 16/541,380

(22) Filed: Aug. 15, 2019

(65) Prior Publication Data

US 2020/0184618 A1    Jun. 11, 2020

(30) Foreign Application Priority Data

Dec. 6, 2018   (KR) ........................ 10-2018-0155757

(51) Int. Cl.
  *G06T 7/00* (2017.01)
  *G06K 9/62* (2006.01)
  *G06K 9/20* (2006.01)

(52) U.S. Cl.
  CPC ............ *G06T 7/001* (2013.01); *G06K 9/2054* (2013.01); *G06K 9/6255* (2013.01);
  (Continued)

(58) Field of Classification Search
  CPC combination set(s) only.
  See application file for complete search history.

(56) References Cited

U.S. PATENT DOCUMENTS 5,861,679 A    1/1999  Nagano
6,166,558 A   12/2000  Jiang et al.
(Continued)

FOREIGN PATENT DOCUMENTS

KR   10-2004-0033621 A   4/2004
KR   10-2005-0033687 A   4/2005
(Continued)

*Primary Examiner* — Iman K Kholdebarin
(74) *Attorney, Agent, or Firm* — Muir Patent Law, PLLC

(57) ABSTRACT

A semiconductor pattern detecting apparatus is provided. The semiconductor pattern detecting apparatus includes a stage configured to position a wafer formed with a semiconductor pattern, the stage extending in a first direction and a second direction perpendicular to the first direction, an electron emitter configured to irradiate first electrons on the semiconductor pattern, an electrode configured to generate an electric field to induce an electric potential on a surface of the semiconductor pattern, a detector configured to detect second electrons emitted from the semiconductor pattern, an imager configured to obtain a plurality of first images by using the second electrons detected by the detector, and at least one controller configured to apply a first voltage and a second voltage different from the first voltage to the electrode alternately and repeatedly and to generate a second image by combining the plurality of first images, wherein the imager is so configured that each of the plurality of first images are obtained when the first voltage is applied to the electrode.

20 Claims, 10 Drawing Sheets

(52) U.S. Cl.
CPC .................. *G06K 2209/19* (2013.01); *G06T 2207/10061* (2013.01); *G06T 2207/20212* (2013.01); *G06T 2207/30148* (2013.01)

(56) References Cited

U.S. PATENT DOCUMENTS

| | | | | |
|---|---|---|---|---|
| 7,109,485 | B2* | 9/2006 | Takane | G06T 5/50 |
| | | | | 250/307 |
| 7,442,923 | B2* | 10/2008 | Todokoro | H01J 37/026 |
| | | | | 250/307 |
| 9,000,365 | B2* | 4/2015 | Mochizuki | G01B 15/04 |
| | | | | 250/306 |
| 9,799,749 | B1* | 10/2017 | Bi | H01L 29/7827 |
| 10,545,018 | B2* | 1/2020 | Yamaguchi | H01L 22/12 |
| 2005/0244049 | A1* | 11/2005 | Onishi | H01J 37/29 |
| | | | | 382/141 |
| 2008/0050848 | A1* | 2/2008 | Abe | H01J 37/28 |
| | | | | 438/14 |
| 2011/0012029 | A1* | 1/2011 | Abe | H01J 7/263 |
| | | | | 250/492.2 |
| 2017/0018066 | A1 | 1/2017 | Weinberg et al. | |
| 2019/0384185 | A1* | 12/2019 | Lo | G03F 9/7084 |

FOREIGN PATENT DOCUMENTS

| | | |
|---|---|---|
| KR | 10-0587638 B1 | 7/2006 |
| KR | 10-2008-0084424 A | 9/2008 |
| KR | 10-2008-0086693 A | 9/2008 |
| KR | 10-2016-0044131 A | 4/2016 |

\* cited by examiner

SEMICONDUCTOR PATTERN DETECTING APPARATUS

This application claims priority to Korean Patent Application No. 10-2018-0155757, filed on Dec. 6, 2018, and all the benefits accruing therefrom under 35 U.S.C. § 119, the disclosure of which is incorporated herein by reference in its entirety.

BACKGROUND

1. Technical Field

The present disclosure relates to a semiconductor pattern detecting apparatus.

2. Description of the Related Art

A semiconductor device inspecting process may include a defect inspection step and a defect review step checking features of inspected defects. For a wafer defect inspecting apparatus, an ultraviolet/deep ultraviolet UV/DUV microscope may be used in related art. UV/DUV microscopes have advantages in that a wide field of view FOV is provided and defect inspection is performed at a high speed.

Further, a high-resolution electron microscope may be used as a wafer defect inspecting apparatus in a related art. The high-resolution electron microscope has an advantage in that form of defect may be checked in detail comparatively because of high resolution.

As semiconductor device structures become thicker (e.g., vertical stack structure), defect inspections and reviews of defects by using an UV/DUV microscope and an electron microscope have limitations. UV/DUV microscopes and electron microscopes have low transmission with respect to semiconductor materials. Therefore, when inspecting and reviewing defects of semiconductor structures by using UV/DUV microscopes and electron microscopes, defects present on at least a portion of a semiconductor structure, e.g., a lower portion of the semiconductor structure become more difficult to be inspected/reviewed.

SUMMARY

The present disclosure provides a semiconductor pattern detecting apparatus for efficiently detecting lower patterns of semiconductor patterns in utilization of capacitance difference of patterns including different materials from each other.

The present disclosure provides a semiconductor pattern detecting apparatus for efficiently detecting lower patterns by efficiently detecting capacitance difference between patterns including different materials from each other by using secondary electrons for detecting/inspecting semiconductor patterns.

According to an exemplary embodiment of the present disclosure, there is provided a semiconductor pattern detecting apparatus, comprising a stage configured to position a wafer formed with a semiconductor pattern, the stage extending in a first direction and a second direction perpendicular to the first direction, an electron emitter configured to irradiate first electrons on the semiconductor pattern, an electrode configured to generate an electric field to induce an electric potential on a surface of the semiconductor pattern, a detector configured to detect second electrons emitted from the semiconductor pattern, an imager configured to obtain a plurality of first images by using the second electron detected by the detector, and at least one controller configured to apply a first voltage and a second voltage different from the first voltage to the electrode alternately and repeatedly and to generate a second image by combining the plurality of first images, wherein the imager is so configured that each of the plurality of first images is obtained when the first voltage is applied to the electrode.

According to an exemplary embodiment of the present disclosure, there is provided a semiconductor pattern detecting apparatus comprising a stage configured to position a wafer formed with a semiconductor pattern, the stage extending in a first direction and a second direction perpendicular to the first direction, an electron emitter configured to emit electrons on the semiconductor pattern, an electrode configured to generate an electric field to induce an electric potential on a surface of the semiconductor pattern, a detector configured to detect secondary electrons generated from the semiconductor pattern, an imager configured to obtain a plurality of first images formed in a third direction perpendicular to an upper surface of the stage by using the secondary electrons detected by the detector, and at least one controller configured to apply a first voltage and a second voltage different from the first voltage to the electrode alternately and repeatedly and to generate a second image by combining the plurality of first images, wherein the imager is so configured that the plurality of first images are obtained when the first voltage is applied to the electrode, and wherein the at least one controller is so configured that time lengths of repeatedly applying the second voltage to the electrode sequentially decrease while the plurality of first images are obtained.

According to an exemplary embodiment of the present disclosure, there is provided a semiconductor pattern detecting apparatus, comprising a stage configured to receive a substrate formed with a semiconductor pattern comprising a first pattern and a second pattern containing different materials from each other, an electron emitter configured to emit electrons on the semiconductor pattern, an electrode configured to generate an electric field to induce an electric potential on a surface of the semiconductor pattern, a detector configured to measure a first capacitance of a first region comprising the first pattern and to measure a second capacitance of a second region comprising the second pattern, an imager configured to obtain a plurality of first images by using the first capacitance and the second capacitance, and at least one controller configured to apply a first voltage and a second voltage different from the first voltage to the electrode alternately and repeatedly and to generate a second image by combining the plurality of first images, wherein the imager is so configured that the plurality of first images are obtained only when the first voltage is applied to the electrode.

Objectives that are intended to be addressed by the present disclosure are not limited to those mentioned above, and other objectives that are not mentioned above may be clearly understood to those skilled in the art based on the description provided below.

BRIEF DESCRIPTION OF THE DRAWINGS

The above and other objects, features and advantages of the present disclosure will become more apparent to those of ordinary skill in the art by describing in detail exemplary embodiments thereof with reference to the accompanying drawings, in which.

DETAILED DESCRIPTION

Hereinbelow, a semiconductor pattern detecting apparatus according to some exemplary embodiments will be described with reference to FIG. 1 to FIG. 4.

Figure 1:
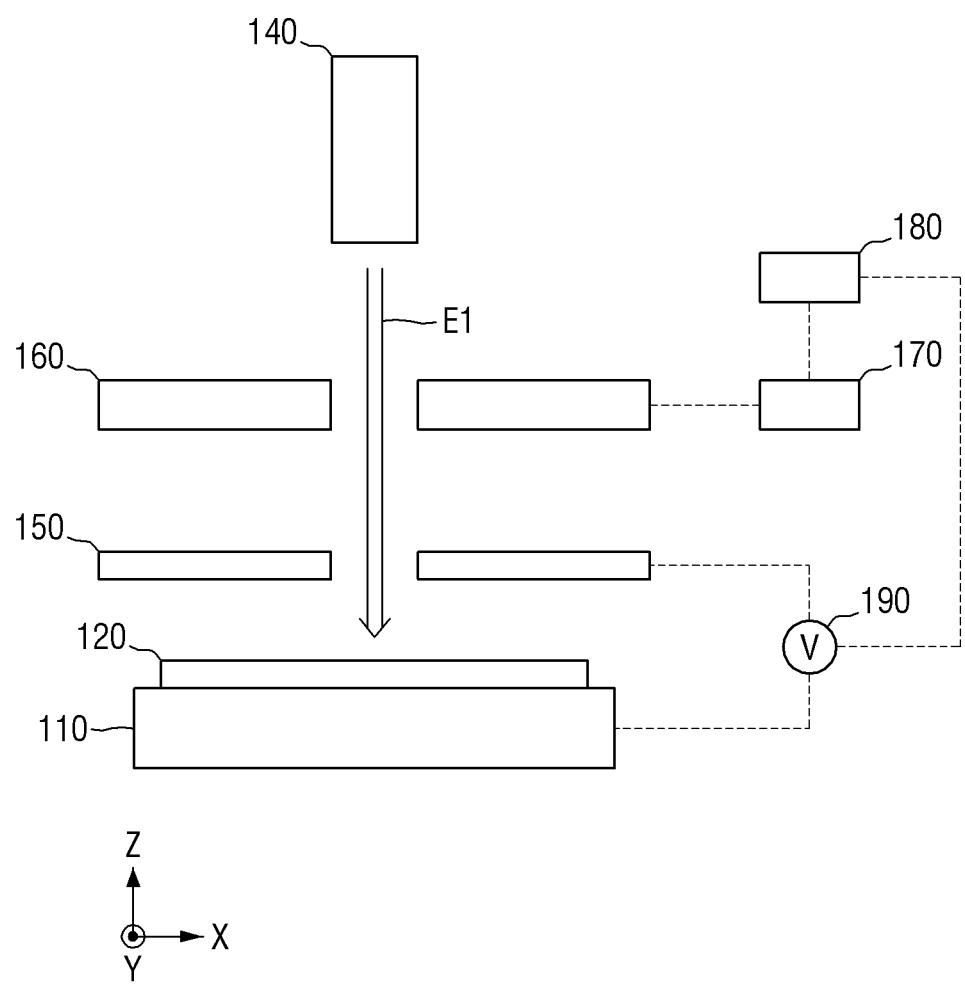
FIG. 1 is a brief view provided to explain a semiconductor pattern detecting apparatus according to some exemplary embodiments.
Figure 2:
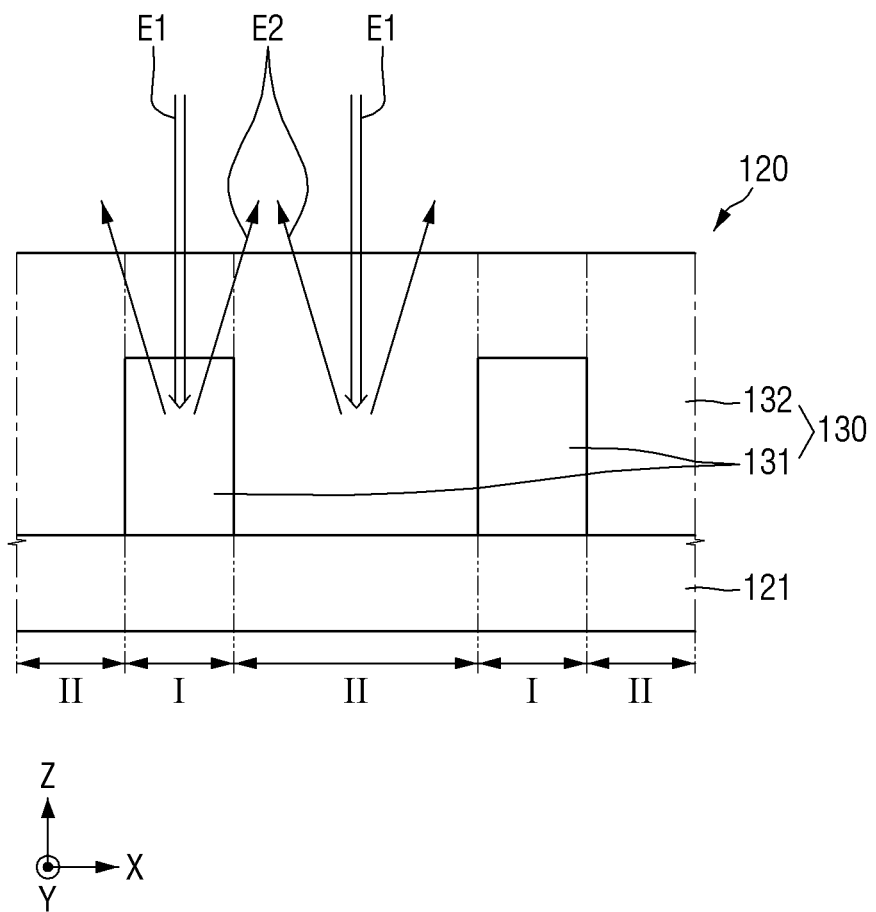
FIG. 2 is an enlarged view of a wafer illustrated in FIG. 1.
Figure 3:
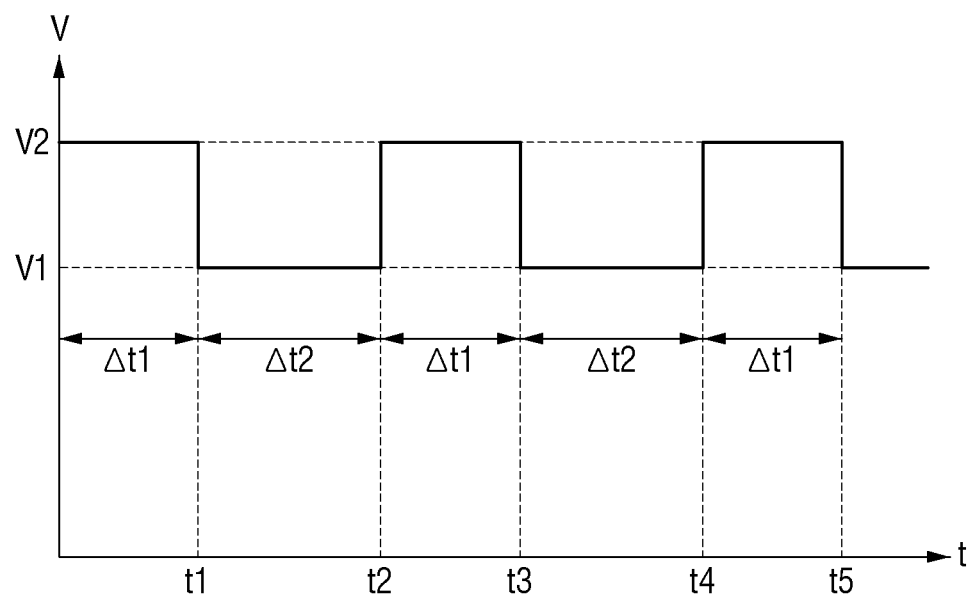
FIG. 3 is a graph provided to explain voltages applied to an electrode over time in a semiconductor pattern detecting apparatus according to some exemplary embodiments.
Figure 4:
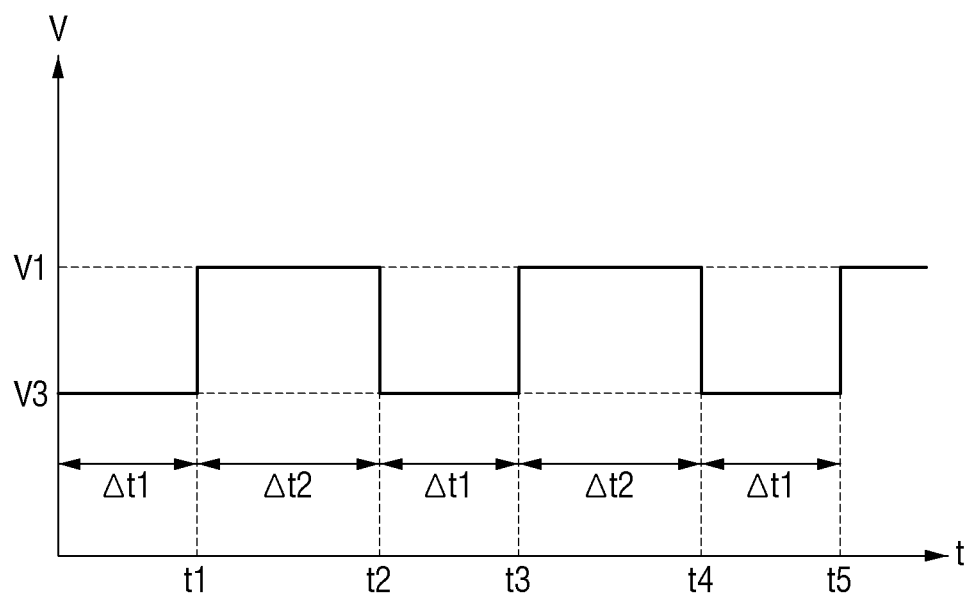
FIG. 4 is a graph provided to explain voltages applied to an electrode over time in a semiconductor pattern detecting apparatus according to some exemplary embodiments.

FIG. 1 is a brief view provided to explain a semiconductor pattern detecting apparatus according to some exemplary embodiments. FIG. 2 is an enlarged view of a wafer illustrated in FIG. 1. FIG. 3 is a graph provided to explain voltages applied to an electrode over time in a semiconductor pattern detecting apparatus according to some exemplary embodiments. FIG. 4 is a graph provided to explain voltage applied to an electrode over time in a semiconductor pattern detecting apparatus according to some exemplary embodiments.

Referring to FIG. 1 to FIG. 3, the semiconductor pattern detecting apparatus according to some exemplary embodiments includes a stage 110, an electron emitter 140, an electrode 150, a detector 160, an imager 170, and a controller 180.

The stage 110 may extend in a first direction X and in a second direction Y perpendicular to the first direction X. A wafer 120 may be loaded on the stage 110, and the wafer 120 may be formed with a semiconductor pattern 130. According to some exemplary embodiments, the stage 110 may be moved in the first direction X and the second direction Y.

The wafer 120 loaded on the stage 110 may include a substrate 121 and a semiconductor pattern 130 formed on the substrate 121. Although FIG. 2 illustrates a simple semiconductor pattern 130 formed on the substrate 121, this is for convenience of explanation, and embodiments are not limited thereto. For example, in certain embodiments, another semiconductor pattern may be additionally formed on the semiconductor pattern 130. For example, the semiconductor pattern 130 may be a lower semiconductor pattern. For example, the semiconductor pattern 130 is not limited to a pattern formed of semiconductor material. For example, the semiconductor pattern 130 may be a pattern formed in a semiconductor device. For example, the semiconductor pattern 130 may include a pattern formed of a semiconductor layer, a conductor layer and/or an insulator layer.

The semiconductor pattern 130 may include a first pattern 131 including a first material and a second pattern 132 including a second material different from the first material.

The first pattern 131 may protrude from the substrate 121 in a third direction Z perpendicular to the first direction X and the second direction Y. The second pattern 132 may fill a space between first patterns 131 and an upper surface of the first pattern 131. For example, the second pattern 132 may cover the substrate 121 exposed between the first patterns 131.

The first pattern 131 may include, for example, conductive materials, and the second pattern 132 may include, for example, insulating materials. However, embodiments are not limited thereto. For example, in some other exemplary embodiments, the first pattern 131 and the second pattern 132 may respectively include different types of conductive materials from each other. In some other exemplary embodiments, the first pattern 131 and the second pattern 132 may include different types of insulating materials from each other.

The electron emitter 140 may be disposed above the stage 110. The electron emitter 140 may generate/emit electrons, for example. The electron emitter 140 may radiate first electron E1 on the semiconductor pattern 130.

The first electron E1 provided from the electron emitter 140 may provide energy to second electron E2 present within the semiconductor pattern 130, and may release the second electron E2 to an external portion of the semiconductor pattern 130. For example, the second electron E2 may be a secondary electron. However, embodiments are not limited thereto. It should be appreciated that multiple first electrons E1 are irradiated on semiconductor pattern 130 to generate/emit a plurality of second electrons E2. The disclosure's reference to a single first electron E1 and a single second electron E2 should be understood to also represent a plurality of such first and second electrons E1, E2.

The electrode 150 may be disposed between the electron emitter 140 and the stage 110. The electrode 150 may induce charge on a surface of the semiconductor pattern 130. For example, the electrode 150 may generate an electric field to induce an electric potential on the surface of the semiconductor pattern 130, and electric charge may be accumulated on the surface of the semiconductor pattern 130 due to the electric potential.

For example, when a positive voltage V2 of FIG. 3 is applied to the electrode 150, a surface of the semiconductor pattern 130 may be induced with negative charge. According to some other exemplary embodiments, when a negative voltage V3 of FIG. 4 is applied to the electrode 150, a surface of the semiconductor pattern 130 may be induced with positive charge.

The detector 160 may be disposed between the electron emitter 140 and the electrode 150. The detector 160 may detect the second electron E2 generated/released/emitted from the semiconductor pattern 130. For example, the detector 160 may detect the second electron E2 (e.g., secondary electron) generated/released as the first electron E1 irradiates the semiconductor pattern 130.

The detector 160 may measure capacitance between the stage 110 and the electrode 150 by using the detected second electron E2.

For example, referring to FIG. 2, the detector 160 may measure a first capacitance of a first region I including the first pattern 131 by using the detected second electron E2. Herein, the first region I may include, e.g., horizontally, a region of the wafer 120 formed with the first pattern 131 and, e.g., vertically, a region between the electrode 150 and the wafer 120 in which the first pattern 131 is formed.

The detector 160 may measure second capacitance of a second region II including the second pattern 132 formed between the first patterns 131 by using the detected second electron E2. Herein, the second region II may include, e.g., horizontally, a region of the wafer 120 formed with the second pattern 132 which is formed between the first patterns 131 and, e.g., vertically, a region between the electrode 150 and the wafer 120 in which the second pattern 132 is formed between the first patterns 131.

For example, when the first pattern 131 includes conductive materials and the second pattern 132 includes insulating materials, the first capacitance may be greater than the second capacitance. For example, the capacitances may be measured with respect to a predetermined unit area, e.g., per a plan view unit area or per a cross-sectional unit area.

Figure 6:
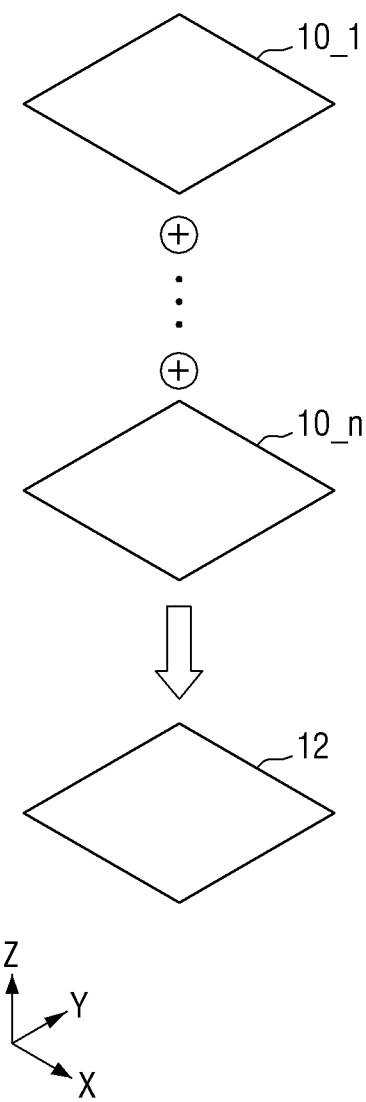
FIG. 6 is a view provided to explain a formation of a second image of a semiconductor pattern by combining a plurality of first images according to the flowchart illustrated in FIG. 5.

The imager 170 may obtain a plurality of first images 10_1 to 10_n of FIG. 6 by using the first capacitance and the second capacitance detected by the detector 160.

For example, the imager 170 may obtain a plurality of first images 10_1 to 10_n of FIG. 6 in which shade/brightness of the first region I including the first pattern 131 is differently formed from shade/brightness of the second region II including the second pattern 132 formed between the first patterns 131.

The plurality of first images 10_1 to 10_n of FIG. 6 may respectively have plane shapes being in parallel with an upper surface of the stage 110. For example, the first images 10_1 to 10_n may be two dimensional images. However, embodiments are not limited thereto.

The controller 180 may apply voltage to the electrode 150. For example, the controller 180 may apply first voltage V1 and second voltage V2, which are different from each other, to the electrode 150. For example, the controller 180 may apply the first voltage V1 which is a reference voltage and the second voltage V2 which is a positive voltage higher than the first voltage V1 to the electrode 150. In this case, a voltage lower than the first voltage V1 may be applied to the stage 110. For example, the controller 180 may generate a voltage difference between the electrode 150 and the stage 110 by controlling a voltage controller 190.

The controller 180 may apply the first voltage V1 and the second voltage V2 to the electrode 150 alternately and repeatedly, e.g., by controlling the voltage controller 190. For example, as illustrated in FIG. 3, the controller 180 may apply the second voltage V2 to the electrode 150 from a start of an inspection/measurement process to a first time t1, the first voltage V1 to the electrode 150 from the first time t1 to a second time t2, the second voltage V2 to the electrode 150 from the second time t2 to a third time t3, the first voltage V1 to the electrode 150 from the third time t3 to a fourth time t4, and the second voltage V2 to the electrode 150 from the fourth time t4 to a fifth time t5.

Time intervals Δt1 during which the second voltage V2 is applied may be the same as each other. For example, a time interval between the start of inspection/measurement and the first time t1, a time interval between the second time t2 and the third time t3, and a time interval between the fourth time t4 and the fifth time t5 may be the same as each other. However, embodiments are not limited thereto. For example, in some other exemplary embodiments, time intervals/lengths applying the second voltage V2 may sequentially decrease or increase.

Time intervals Δt2 during which the first voltage V1 is applied may be the same as each other. For example, a time interval between the first time t1 and the second time t2 and a time interval between the third time t3 and the fourth time t4 may be the same as each other.

The imager 170 may obtain a plurality of first images 10_1 to 10_n of FIG. 6 when the first voltage V1 is applied to the electrode 150. For example, the imager 170 may not obtain any of first images 10_1 to 10_n of FIG. 6 when the second voltage V2 is applied to the electrode 150.

According to some other exemplary embodiments, as illustrated in FIG. 4, the controller 180 may apply the first voltage V1 as a reference voltage and a third voltage V3 which is negative voltage lower than the first voltage V1 to the electrode 150.

In this case, the imager 170 may obtain a plurality of first images 10_1 to 10_n of FIG. 6 when the first voltage V1 is applied to the electrode 150. For example, the imager 170 may not obtain any of first images 10_1 to 10_n of FIG. 6 when the third voltage V3 is applied to the electrode 150.

The controller 180 may generate second image 12 of FIG. 6 by combining a plurality of first images 10_1 to 10_n of FIG. 6. This will be described in detail below.

Hereinbelow, a method for detecting semiconductor patterns by using a semiconductor pattern detecting apparatus according to some exemplary embodiments will be described with reference to FIG. 1 to FIG. 6.

Figure 5:
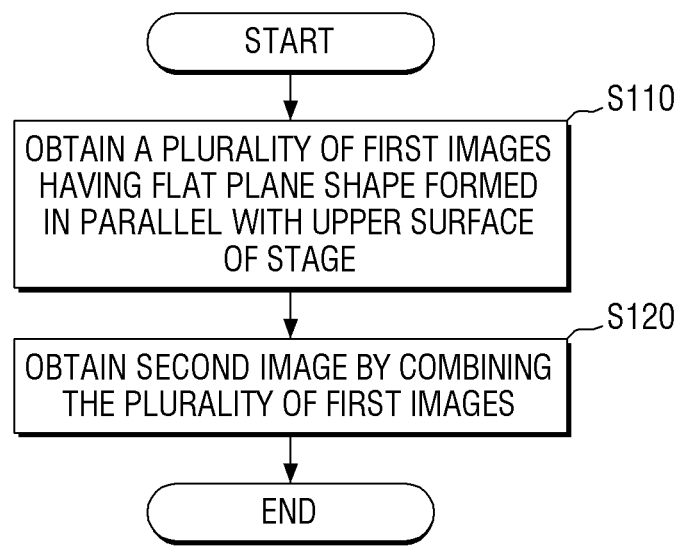
FIG. 5 is a flowchart provided to explain a method for detecting semiconductor patterns by using a semiconductor pattern detecting apparatus according to some exemplary embodiments.

FIG. 5 is a flowchart provided to explain a method for detecting semiconductor patterns by using a semiconductor pattern detecting apparatus according to some exemplary embodiments. FIG. 6 is a view provided to explain a formation of the second image of a semiconductor pattern by combining a plurality of first images according to a flowchart illustrated in FIG. 5.

Referring to FIG. 1 to FIG. 6, the imager 170 may obtain a plurality of first images 10_1 to 10_n having plane shapes formed in parallel with an upper surface of the stage 110.

For example, the controller 180 may generate electrically different potentials between the electrode 150 and the stage 110 by applying the second voltage V2, which is a positive voltage, to the electrode 150.

Next, the controller 180 may apply the first voltage V1, which is a reference voltage, to the electrode 150. The detector 160 may detect the second electron E2 generated/released from the semiconductor pattern 130 and measure a capacitance between the electrode 150 and the stage 110 while the first voltage V1 is applied to the electrode 150. For example, the capacitance between the electrode 150 and the stage 110 may be measured directly (e.g., measuring the capacitance with a capacitance meter) or indirectly (e.g., other measuring methods than using a capacitance meter e.g., by measuring discharging electrons or emitting electrons). For example, in certain embodiments, the capacitance may be measured by an amount/density of electrons emitting from a surface of a semiconductor pattern or from a surface of a dielectric pattern.

Next, the imager 170 may obtain a plurality of first images 10_1 to 10_n by using the measured capacitance between the electrode 150 and the stage 110. The plurality of first images 10_1 to 10_n may be obtained when the first voltage V1 is applied to the electrode.

Next, the controller 180 may generate a second image 12 by combining the plurality of first images 10_1 to 10_n obtained from the imager 170 at step S120.

The second image 12 may be an image having a shade according to the capacitance between the electrode 150 and the stage 110. For example, the second image 12 may have shapes similar to the plurality of first images 10_1 to 10_n. The second image 12 may be formed by overlapping each of the plurality of first images 10_1 to 10_n. Herein, overlapping of each of the plurality of first images 10_1 to 10_n may represent/indicate that the plurality of first images 10_1 to 10_n are respectively overlapping with each other, and not the plurality of first images 10_1 to 10_n is stacked together. For example, in certain embodiments, a portion of each of the first images 10_1 to 10_n may overlap a portion of another first image.

The semiconductor pattern 130 formed on the wafer 120 may be detected through the above described method.

The semiconductor pattern detecting apparatus according to some exemplary embodiments may detect lower patterns, e.g., than a surface pattern, efficiently and better than using a scanning electron microscope by detecting semiconductor patterns by using capacitance differences of patterns including different materials from each other.

Further, the semiconductor pattern detecting apparatus according to some exemplary embodiments may efficiently detect patterns formed in a lower layer than a surface layer by efficiently classifying capacitance difference between the patterns including different materials from each other by using secondary electrons in detecting the semiconductor patterns.

Hereinbelow, a semiconductor pattern detecting apparatus according to some other exemplary embodiments will be described with reference to FIG. 1, FIG. 7 and FIG. 8. In describing the exemplary embodiments, the same features as and/or similar features to the semiconductor pattern detecting apparatus illustrated in FIG. 1 to FIG. 6 may be omitted or briefly described.

Figure 7:
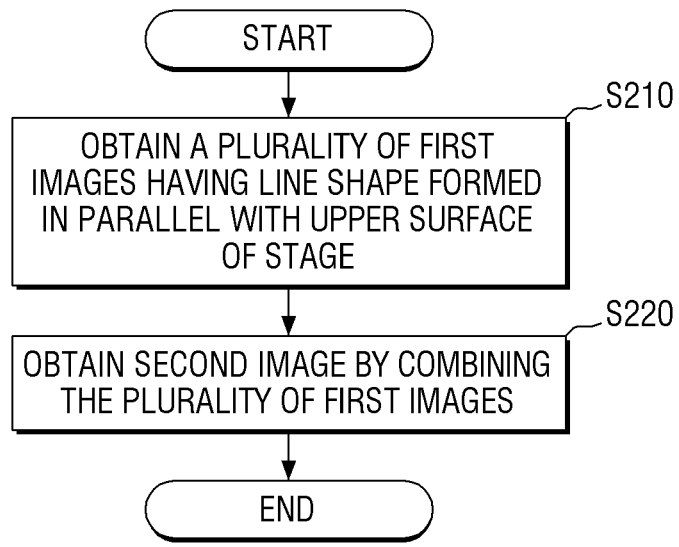
FIG. 7 is a flowchart provided to explain a method for detecting semiconductor patterns by using a semiconductor pattern detecting apparatus according to some exemplary embodiments.

FIG. 7 is a flowchart provided to explain a method for detecting semiconductor pattern by using a semiconductor pattern detecting apparatus according to some exemplary embodiments. FIG. 8 is a view provided to explain a formation of a second image of a semiconductor pattern by combining a plurality of first images according to a flowchart illustrated in FIG. 7.

Figure 8:
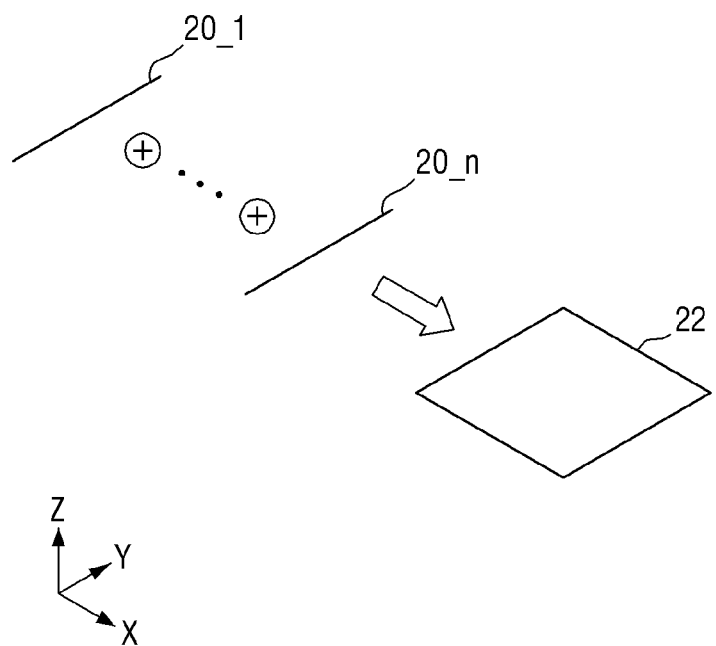
FIG. 8 is a view provided to explain a formation of a second image of a semiconductor pattern by combining a plurality of first images according to the flowchart illustrated in FIG. 7.

Referring to FIG. 1, FIG. 7 and FIG. 8, in the semiconductor pattern detecting apparatus according to some exemplary embodiments, the plurality of first images 20_1 to 20_n respectively have line shapes. For example, each of the plurality of first images 20_1 to 20_n may have a line shape extending in the second direction Y. For example, the line shape images may be linear images, e.g. elongated images. For example, the line shape images may be two dimensional images having relatively narrow widths in a first direction and elongated in a second direction perpendicular to the first direction.

The imager 170 may obtain the plurality of first images 20_1 to 20_n having line shapes formed in parallel with an upper surface of the stage 110 at step S210.

For example, the imager 170 may obtain the plurality of first images 20_1 to 20_n respectively having line shapes extending in the second direction Y by using the measured capacitance between the electrode 150 and the stage 110.

The imager 170 may sequentially obtain the first images 20_1 to 20_n, e.g., by initially obtaining the first image 20_1 and sequentially obtaining the first images in the first direction X until obtaining the final first image 20_n. In this case, for example, the imager 170 may obtain the plurality of first images 20_1 to 20_n while the electron emitter 140 moves in the first direction X. According to some other exemplary embodiments, the plurality of first images 20_1 to 20_n may be obtained while the stage 110 moves in the first direction X.

The controller 180 may generate second image 22 by combining the plurality of first images 20_1 to 20_n obtained from the imager 170 at step S220. The second image 22 may be formed as each of the plurality of first images 20_1 to 20_n may be stacked in the first direction X. For example, the second image 22 may be formed by connecting the first images 20_1 to 20_n together, e.g., in series in the first direction.

Hereinbelow, a semiconductor pattern detecting apparatus according to some other exemplary embodiments will be described with reference to FIG. 1, FIG. 9 and FIG. 10. In describing the exemplary embodiments, the same features as and/or similar features to the semiconductor pattern detecting apparatus illustrated in FIG. 1 to FIG. 6 may be omitted or briefly described.

Figure 9:
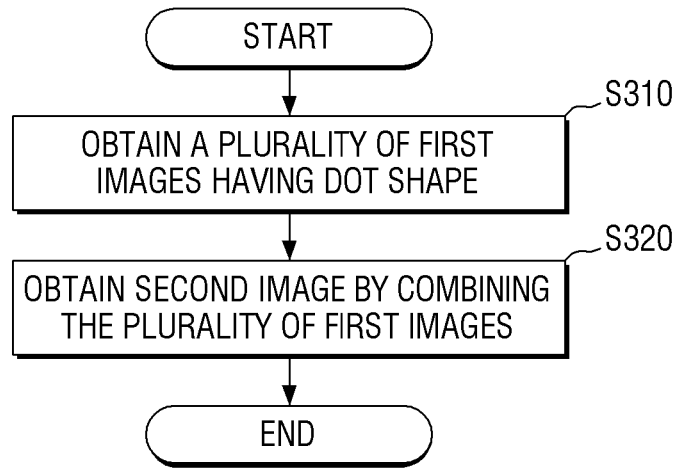
FIG. 9 is a flowchart provided to explain a method for detecting semiconductor patterns by using a semiconductor pattern detecting apparatus according to some exemplary embodiments.

FIG. 9 is a flowchart provided to explain a method for detecting semiconductor pattern by using a semiconductor pattern detecting apparatus according to some other exemplary embodiments. FIG. 10 is a view provided to explain a formation of a second image of a semiconductor pattern by combining a plurality of first images according to a flowchart illustrated in FIG. 9.

Figure 10:
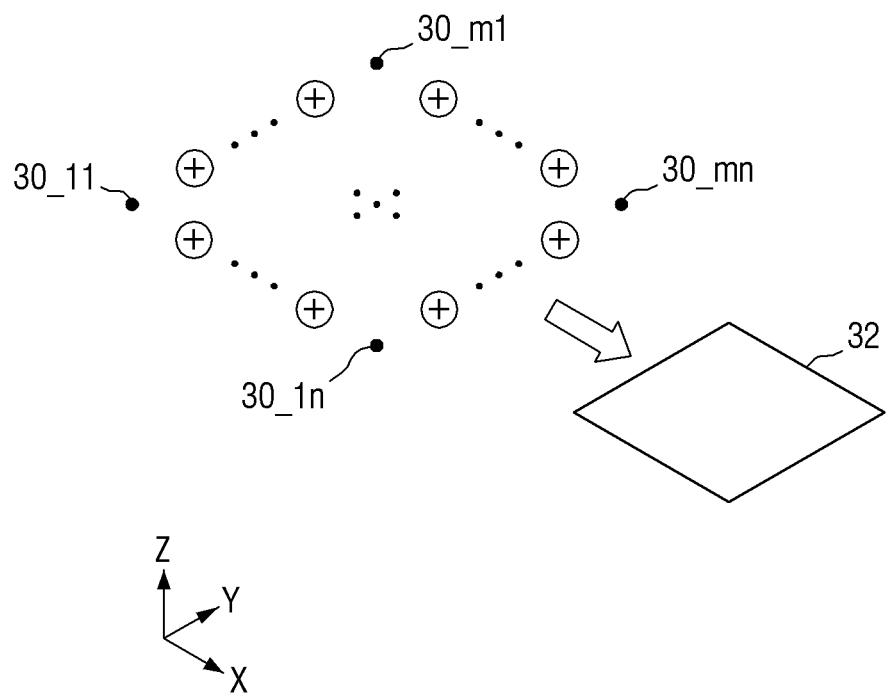
FIG. 10 is a view provided to explain a formation of a second image of a semiconductor pattern by combining a plurality of first images according to the flowchart illustrated in FIG. 9.

Referring to FIG. 1, FIG. 9 and FIG. 10, in the semiconductor pattern detecting apparatus according to some exemplary embodiments, a plurality of first images 30_11 to 30_mn may respectively have dot shapes.

The imager 170 may obtain the plurality of first images 30_11 to 30_mn having dot shapes at step S310. For example, each of the dot shape first images 30_11 to 30_mn may be a minimal area image compared with the whole image to be inspected/measured, e.g., second image 32 as described below.

For example, the imager 170 may obtain the plurality of first images 30_11 to 30_mn having dot shapes which are spaced from each other in the first direction X and the second direction Y by using the measured capacitances between the electrode 150 and the stage 110. In certain embodiments, adjacent images of the first images 30_11 to 30_mn (e.g., indicated by adjacent numbers of 11-mn) may represent directly adjacent unit images within the whole area of image to be inspected/measured, e.g., the second image 32 as described below.

The imager 170 may sequentially obtain the first images 30_11 to 30_mn by initially obtaining the first image 30_11 and sequentially obtaining the first images in the first direction X and the second direction Y until obtaining the final first image 30_mn. In this case, for example, the imager 170 may obtain the plurality of first images 30_11 to 30_mn while the electron emitter 140 moves in the first direction X and the second direction Y. According to some other exemplary embodiments, the plurality of first images 30_11 to 30_mn may be obtained while the stage 110 is moving in the first direction X and the second direction Y.

The controller 180 may generate second image 32 by combining the plurality of first images 30_11 to 30_mn obtained from the imager 170 at step S320. The second image 32 may be formed as each of the plurality of first images 30_11 to 30_mn may be stacked in the first direction X and the second direction Y. For example, the second image 32 may be formed by connecting the first images 30_11 to 30_mn in the first direction X and the second direction Y.

Hereinbelow, a semiconductor pattern detecting apparatus according to some other exemplary embodiments will be explained with reference to FIG. 1 and FIG. 11 to FIG. 13. In describing the exemplary embodiments, the same features as and/or similar features to the semiconductor pattern detecting apparatus illustrated in FIG. 1 to FIG. 6 may be omitted or briefly described.

Figure 11:
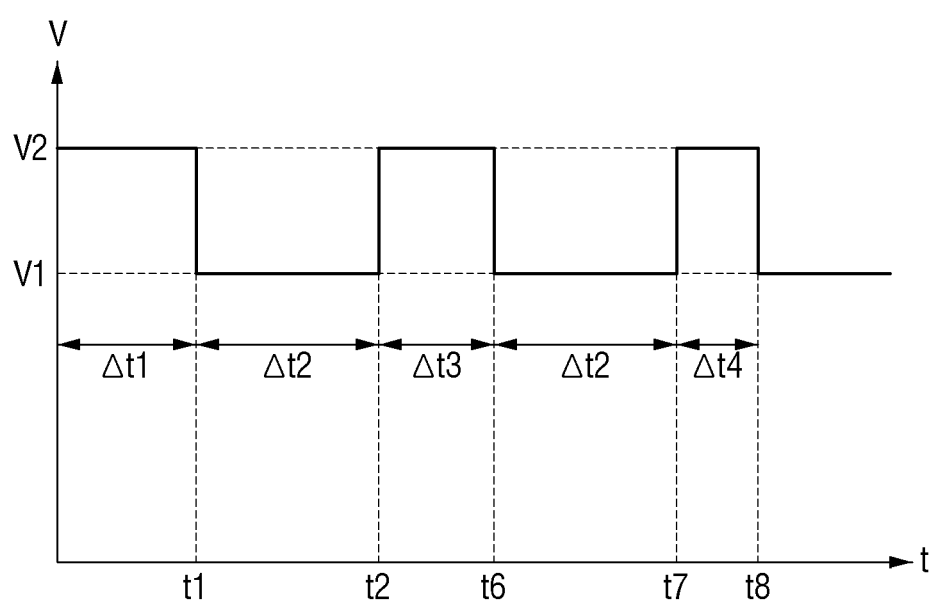
FIG. 11 is a graph provided to explain voltages applied to an electrode over time in a semiconductor pattern detecting apparatus according to some exemplary embodiments.
Figure 12:
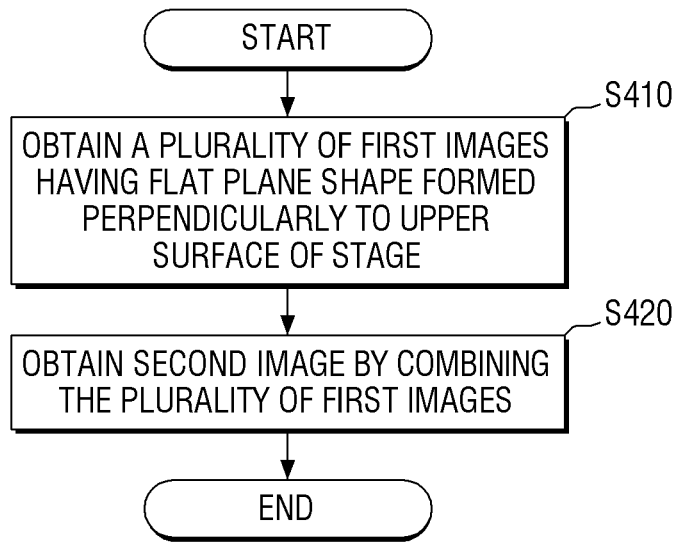
FIG. 12 is a flowchart provided to explain a method for detecting a semiconductor pattern by using a semiconductor pattern detecting apparatus according to some exemplary embodiments.
Figure 13:
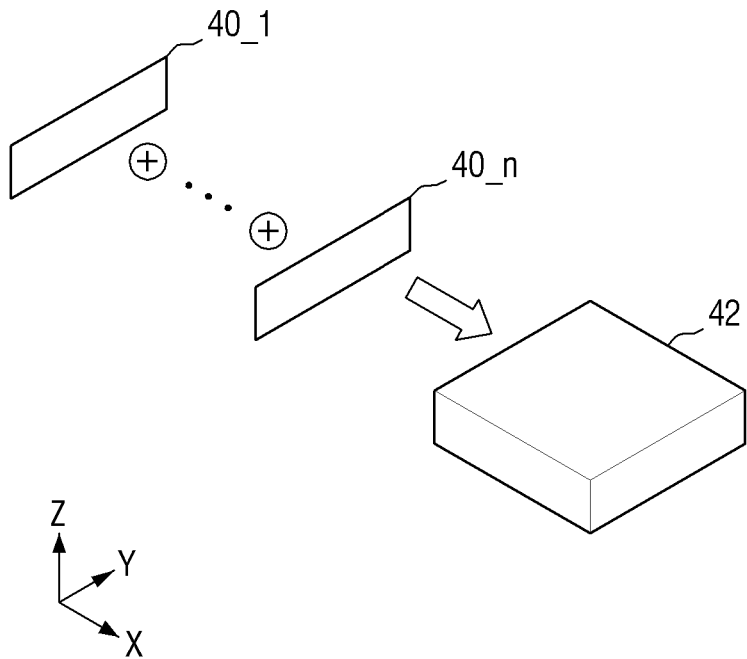
FIG. 13 is a view provided to explain a formation of a second image in a semiconductor pattern by combining a plurality of first images according to the flowchart illustrated in FIG. 12.
Figure 14:
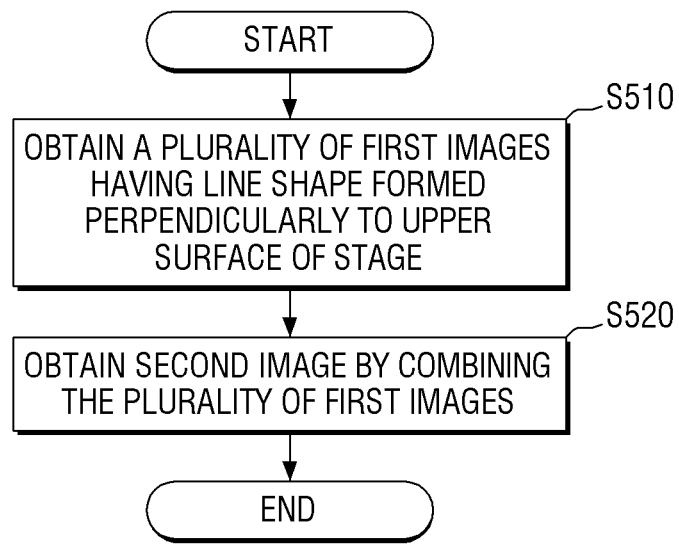
FIG. 14 is a flowchart provided to explain a method for detecting semiconductor patterns by using a semiconductor pattern detecting apparatus according to some exemplary embodiments.
Figure 15:
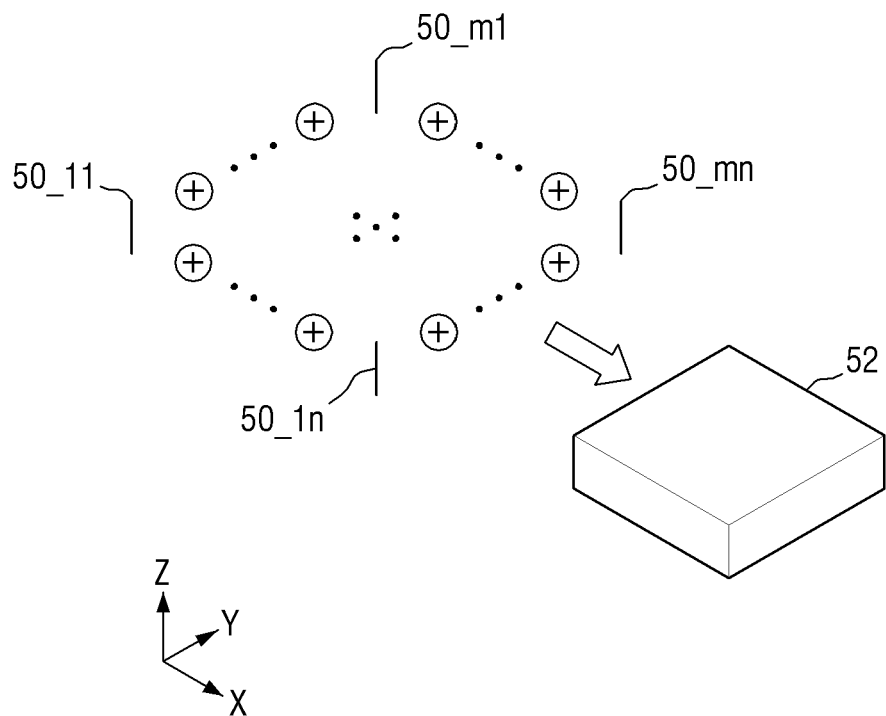
FIG. 15 is a view provided to explain a formation of a second image in a semiconductor pattern by combining a plurality of first images according to the flowchart illustrated in FIG. 14.

FIG. 11 is a graph provided to explain voltage applied to an electrode over time in a semiconductor pattern detecting apparatus according to some exemplary embodiments. FIG. 12 is a flowchart provided to explain a method for detecting semiconductor patterns by using a semiconductor pattern detecting apparatus according to some exemplary embodiments. FIG. 13 is a view provided to explain a formation of a second image of a semiconductor pattern by combining a plurality of first images according to a flowchart illustrated in FIG. 12.

Referring to FIG. 1 and FIG. 11 to FIG. 13, in the semiconductor pattern detecting apparatus according to some exemplary embodiments, a plurality of first images 40_1 to 40_n may respectively have plane shapes. For example, each of the plurality of first images 40_1 to 40_n may have a plane shape formed in the third direction perpendicular to an upper surface of the stage 110.

The controller 180 may apply the first voltage V1 and the second voltage V2 to the electrode 150 alternately and repeatedly. For example, as illustrated in FIG. 11, the controller 180 may apply the second voltage V2 to the electrode 150 from a start an inspection/measurement process to a first time t1, apply the first voltage V1 to the electrode 150 to a second time t2 from the first time t1, apply the second voltage V2 to the electrode 150 to a sixth time t6 from the second time t2, apply the first voltage V1 to the electrode 150 to a seventh time t7 from the sixth time t6, and apply the second voltage V2 to the electrode 150 to an eighth time t8 from the seventh time t7.

Time intervals/lengths of applying the second voltage V2 may decrease sequentially. For example, time interval Δt1 between the start of the inspection/measurement and the first time t1 may be longer than time interval Δt3 between the second time t2 and the sixth time t6. Further, time interval Δt3 between the second time t2 and the sixth time t6 may be longer than time interval Δt4 between the seventh time t7 and the eighth time t8.

Each of the plurality of first images 40_1 to 40_n may be formed as line shape images from a line shape image nearest to the stage 110 to a line shape image farthest from the stage 110 may be stacked. When obtaining a following line shape image after obtaining one line shape image, time intervals/lengths thereof may sequentially decrease.

The imager 170 may obtain the plurality of first images 40_1 to 40_n having plane shapes formed perpendicularly to an upper surface of the stage 110 at step S410.

For example, the imager 170 may obtain the plurality of first images 40_1 to 40_n having plane shapes extending in the second direction Y and the third direction Z by using the measured capacitance between the electrode 150 and the stage 110.

The imager 170 may sequentially obtain the first images 40_1 to 40_n by initially obtaining first image 40_1 and sequentially obtaining the first image in the first direction X until obtaining the final first image 40_n. In this case, for example, the imager 170 may obtain the plurality of first images 40_1 to 40_n while the electron emitter 140 moves in the first direction X. According to some other exemplary embodiments, for example, the plurality of first images 40_1 to 40_n may be obtained while the stage 110 moves in the first direction X.

Time intervals Δt2 applying the first voltage V1 may be the same as each other. For example, a time interval between the first time t1 and the second time t2 and a time interval between the sixth time t6 and the seventh time t7 may be the same as each other.

The controller 180 may generate second image 42 by combining the plurality of first images 40_1 to 40_n obtained by the imager 170 at step S420. The second image 42 may be formed as each of the plurality of first images 40_1 to 40_n may be stacked in the first direction X.

Hereinbelow, a semiconductor pattern detecting apparatus according to some other exemplary embodiments will be described with reference to FIG. 1, FIG. 11, FIG. 14 and FIG. 15. In describing the exemplary embodiments, the same features as and/or similar features to the semiconductor pattern detecting apparatus illustrated in FIG. 1 to FIG. 6 may be omitted or briefly described.

Referring to FIG. 1, FIG. 11, FIG. 14 and FIG. 15, in the semiconductor pattern detecting apparatus according to some exemplary embodiments, a plurality of first images 50_11 to 50_mn may respectively have line shapes. For example, each of the plurality of first images 50_11 to 50_mn may have a line shape formed in the third direction perpendicular to an upper surface of the stage 110.

Time intervals/lengths of applying the second voltage V2 may decrease sequentially. Each of the plurality of first images 50_11 to 50_mn may be formed as dot shape images from a dot shape image nearest to the stage 110 to a dot shape image farthest from the stage 110 may be stacked. When obtaining a following dot shape image after obtaining one dot shape image, time intervals/lengths thereof may decrease sequentially.

The imager 170 may obtain the plurality of first images 50_11 to 50_mn having line shapes formed perpendicularly to an upper surface of the stage 110 at step S510.

For example, the imager 170 may obtain the plurality of first images 50_11 to 50_mn having line shapes extending in the third direction Z by using the measured capacitance between the electrode 150 and the stage 110.

The imager 170 may sequentially obtain first images 50_11 to 50_mn by initially obtaining the first image 50_11 and sequentially obtaining the first images in the first direction X and the second direction Y until obtaining the final first image 50_mn. In this case, for example, the imager 170 may obtain the plurality of first images 50_11 to 50_mn while the electron emitter 140 moves in the first direction X and the second direction Y. According to some other exemplary embodiments, for example, the plurality of first images 50_11 to 50_mn may be obtained while the stage 110 is moving in the first direction X and the second direction Y.

Time intervals Δt2 applying the first voltage V1 may be the same as each other. For example, a time interval between the first time t1 and the second time t2 and a time interval between the sixth time t6 and the seventh time t7 may be the same as each other.

The controller 180 may generate second image 52 by combining the plurality of first images 50_11 to 50_mn obtained from the imager 170 at step S520. The second image 52 may be formed as each of the plurality of first images 50_11 to 50_mn may be stacked in the first direction X and the second direction Y. For example, the second image 52 may be formed by connecting the first images 50_11 to 50_mn in the first direction and the second direction together.

Hereinafter, a method of manufacturing a semiconductor device according to an embodiment of the present disclosure will be described.

According to the method of manufacturing a semiconductor device, a substrate may be on the stage 110 of a semiconductor pattern inspection/detection apparatus according to an embodiment of the present disclosure. The substrate may be a semiconductor wafer 120 or another substrate, for example, a crystalline silicon substrate, a crystalline germanium substrate or a crystalline silicon-germanium substrate. Various semiconductor patterns, conductor patterns and/or insulator patterns may be formed on the substrate to form circuits including transistors, capacitors and/or switches via a plurality of manufacturing processes including multiple steps of photolithography processes before the substrate is provided on the stage 110. In the semiconductor pattern inspection/detection apparatus, the patterns formed on the substrate may be inspected to be determined whether the substrate and/or portions of the substrate meet a predetermined specification. When the inspection result meets the predetermined specification at least with respect to a portion of the substrate, the substrate may be processed one or more following manufacturing steps and/or diced to form semiconductor package devices. The performance of the pattern inspection/detection step may be total inspection inspecting all of the substrates and or all dies, or the inspection may be a sample inspection. When the inspection is a sample inspection, a sample inspection result may represent the quality of a batch of substrate. The batch may be a bundle of substrates, a set of substrates produced in a predetermined period of time. Therefore, the sample inspection result may be used to determine whether the whole batch of wafers and/or dies is processed a following process.

Exemplary embodiments according to the present disclosure were explained hereinabove with reference to the drawings attached. However it should be understood that embodiments are not limited to the aforementioned exemplary embodiments, but may be fabricated in various different forms, and may be implemented by a person skilled in the art in other specific forms without altering the technical concept or essential characteristics of the present disclosure. Accordingly, it will be understood that the exemplary embodiments described above are only illustrative, and should not be construed as limiting.

What is claimed is:

1. A semiconductor pattern detecting apparatus, comprising:
   a stage configured to position a wafer formed with a semiconductor pattern, the stage extending in a first direction and a second direction perpendicular to the first direction;
   an electron emitter configured to irradiate first electrons on the semiconductor pattern;
   an electrode configured to generate an electric field to induce an electric potential on a surface of the semiconductor pattern;
   a detector configured to detect second electrons emitted from the semiconductor pattern;
   an imager configured to obtain a plurality of first images by using the second electrons detected by the detector; and
   at least one controller configured to apply a first voltage and a second voltage different from the first voltage to the electrode alternately and repeatedly and to generate a second image by combining the plurality of first images,
   wherein the imager is so configured that each of the plurality of first images is obtained when the first voltage is applied to the electrode.

2. The semiconductor pattern detecting apparatus of claim 1, wherein the second electrons are secondary electrons.

3. The semiconductor pattern detecting apparatus of claim 1, wherein the electrode is disposed between the stage and the electron emitter.

4. The semiconductor pattern detecting apparatus of claim 1, wherein time lengths of repeatedly applying the second voltage to the electrode are the same as each other.

5. The semiconductor pattern detecting apparatus of claim 4, wherein each of the first images has a plane shape extending in parallel with an upper surface of the stage.

6. The semiconductor pattern detecting apparatus of claim 4, wherein each of the first images has a line shape extending in the second direction.

7. The semiconductor pattern detecting apparatus of claim 6, wherein the second image is formed by combining the plurality of first images sequentially formed in the first direction.

8. The semiconductor pattern detecting apparatus of claim 4, wherein each of the first images has a dot shape.

9. The semiconductor pattern detecting apparatus of claim 8, wherein the second image is formed by combining the plurality of first images formed sequentially in the first direction and the second direction.

10. The semiconductor pattern detecting apparatus of claim 1, wherein the second voltage is higher than the first voltage.

11. The semiconductor pattern detecting apparatus of claim 1, wherein the second voltage is lower than the first voltage.

12. A semiconductor pattern detecting apparatus, comprising:
   a stage configured to position a wafer formed with a semiconductor pattern, the stage extending in a first direction and a second direction perpendicular to the first direction;
   an electron emitter configured to emit electrons on the semiconductor pattern;

an electrode configured to generate an electric field to induce an electric potential on a surface of the semiconductor pattern;

a detector configured to detect secondary electrons generated from the semiconductor pattern;

an imager configured to obtain a plurality of first images formed in a third direction perpendicular to an upper surface of the stage by using the secondary electrons detected by the detector; and at least one controller configured to apply a first voltage and a second voltage different from the first voltage to the electrode alternately and repeatedly and to generate a second image by combining the plurality of first images, wherein the imager is so configured that the plurality of first images are obtained when the first voltage is applied to the electrode, and wherein the at least one controller is so configured that time lengths of repeatedly applying the second voltage to the electrode sequentially decrease while the plurality of first images are obtained.

13. The semiconductor pattern detecting apparatus of claim 12, wherein each of the first images has a plane shape.

14. The semiconductor pattern detecting apparatus of claim 13, wherein the second image is formed by combining the plurality of first images sequentially formed in the first direction.

15. The semiconductor pattern detecting apparatus of claim 12, wherein each of the first images has a line shape.

16. The semiconductor pattern detecting apparatus of claim 15, wherein the second image is formed by combining the plurality of first images formed sequentially in the first direction and the second direction.

17. A semiconductor pattern detecting apparatus, comprising:

a stage configured to receive a substrate formed with a semiconductor pattern comprising a first pattern and a second pattern containing different materials from each other;

an electron emitter configured to emit electrons on the semiconductor pattern;

an electrode configured to generate an electric field to induce an electric potential on a surface of the semiconductor pattern;

a detector configured to measure a first capacitance of a first region comprising the first pattern and to measure a second capacitance of a second region comprising the second pattern;

an imager configured to obtain a plurality of first images by using the first capacitance and the second capacitance; and at least one controller configured to apply a first voltage and a second voltage different from the first voltage to the electrode alternately and repeatedly and to generate a second image by combining the plurality of first images, wherein the imager is so configured that the plurality of first images are obtained when the first voltage is applied to the electrode.

18. The semiconductor pattern detecting apparatus of claim 17, wherein the electrode is disposed between the stage and the electron emitter.

19. The semiconductor pattern detecting apparatus of claim 17, wherein time lengths of repeatedly applying the second voltage to the electrode are the same as each other.

20. The semiconductor pattern detecting apparatus of claim 17, wherein time lengths of repeatedly applying the second voltage sequentially decrease while obtaining the plurality of first images.

* * * * *